United States Patent
Chen

(10) Patent No.: US 7,612,299 B2
(45) Date of Patent: Nov. 3, 2009

(54) SHIELD ASSEMBLY WITH GASKETS

(75) Inventor: Jian-Ping Chen, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

(*) Notice: Subject to any disclaimer, the term of this patent is extended or adjusted under 35 U.S.C. 154(b) by 0 days.

(21) Appl. No.: 12/168,860

(22) Filed: Jul. 7, 2008

(65) Prior Publication Data

US 2009/0050360 A1 Feb. 26, 2009

(30) Foreign Application Priority Data

Aug. 20, 2007 (CN) .................... 2007 2 0200855

(51) Int. Cl.
*H01R 13/648* (2006.01)
*H05K 9/00* (2006.01)

(52) U.S. Cl. .............. 174/359; 174/368; 174/377; 174/387; 361/816; 439/607

(58) Field of Classification Search .......... 174/377, 174/384, 387, 368, 359; 361/816, 818; 439/607
See application file for complete search history.

(56) References Cited

U.S. PATENT DOCUMENTS

| 6,943,287 | B2 | 9/2005 | Lloyd et al. |
| 2003/0169581 | A1* | 9/2003 | Bright et al. ............. 361/816 |
| 2004/0075993 | A1* | 4/2004 | Hwang ................. 361/818 |
| 2006/0279937 | A1* | 12/2006 | Manson et al. .......... 361/724 |

* cited by examiner

*Primary Examiner*—Hung V Ngo
(74) *Attorney, Agent, or Firm*—Frank R. Niranjan

(57) ABSTRACT

A shielding assembly (100) for protecting several modules from electromagnetic interference, includes a cage (40) installable on a circuit board (200), a first gasket (20), and a second gasket (50). The cage includes a front end portion (41), a cover (42), a base (48), and at least one interior wall (44). The cover, the at least one interior wall and the base cooperatively define at least two spaces (400) for receiving the modules. The first gasket encircles the front end portion of the cage. The first gasket electrically and mechanically contacts the cover and the base to provide an electromagnetic interference seal between the cage and a device in which the cage is mounted. The second gasket attaches against the cage and the circuit board respectively so as to electrically shield the modules in the cage from electromagnetic interference.

18 Claims, 4 Drawing Sheets

SHIELD ASSEMBLY WITH GASKETS

BACKGROUND

1. Field of the Invention

The present invention relates to a shield assembly for shielding electromagnetic interference (EMI), and specifically to a shield assembly with gaskets configured for shielding a transceiver module from EMI.

2. Description of Related Art

Transceiver modules provide bidirectional transmission of data between an electrical interface and an optical data link. The module receives electrical signals and converts them into optical signals that are then transmitted over the optical data link. The module also receives optical signals, converts them into electrical signals, and transmits the electrical signals to the electrical interface.

Conventionally, the module connected to a metal cage is mounted on a printed circuit board (PCB) of a host computer, an input/output system, a peripheral device, or a switch. The metal cage functions to dissipate electrostatic buildup, and serves as an electromagnetic shield. The cage often includes a pair of parallel sidewalls, a top wall, a bottom wall, a front end portion, and a rear end portion. In assembly, the cage is mounted on the PCB, then the PCB is installed in a device with the front end portion of the cage inserted into an opening of a front panel of the device. The module is inserted into the cage through the opening of the front panel.

However, there are gaps between the front panel of the device and the cage, between the cage and the PCB, and between the front end portion and the module, thereby the cage does not effectively shield the module from external electromagnetic waves, and also does not effectively contain electromagnetic waves emanating from the module.

Therefore, a heretofore unaddressed need exists in the industry to overcome the aforementioned deficiencies and inadequacies.

SUMMARY

One aspect of the embodiment, a shielding assembly for protecting at least one electrical module from electromagnetic interference, includes a cage installable on a circuit board, a conductive first gasket, and a electrically-conductive, compressible second gasket. The cage includes a front end portion, a cover, a base, and at least one interior wall. The cover, the at least one interior wall, and the base cooperatively define a plurality of spaces for receiving the modules. The first gasket encircles the front end portion of the cage. The first gasket electrically and mechanically contacts the cover and the base to provide an electromagnetic interference seal between the cage and a device in which the cage is mounted. The second gasket attaches to the cage and the circuit board respectively so as to electrically shield the modules in the cage from electromagnetic interference.

Other advantages and novel features will become more apparent from the following detailed description when taken in conjunction with the accompanying drawings, in which:

DETAILED DESCRIPTION OF THE EMBODIMENTS

Figure 1:
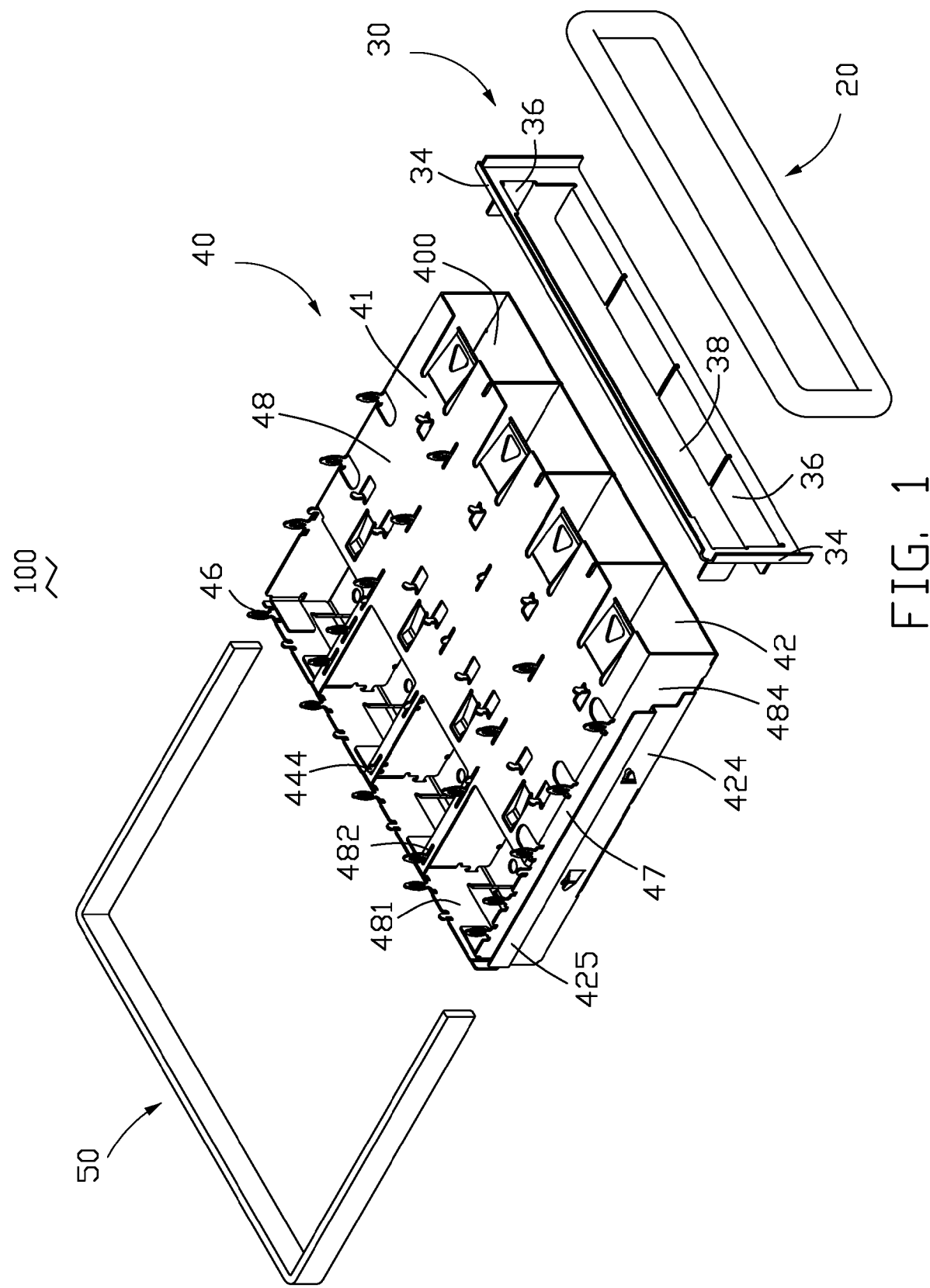
FIG. 1 is an exploded, inverted, perspective view of a shielding assembly in accordance with an exemplary embodiment of the present invention, the shielding assembly including a cage, a first gasket, a second gasket, and a backing member.
Figure 4:
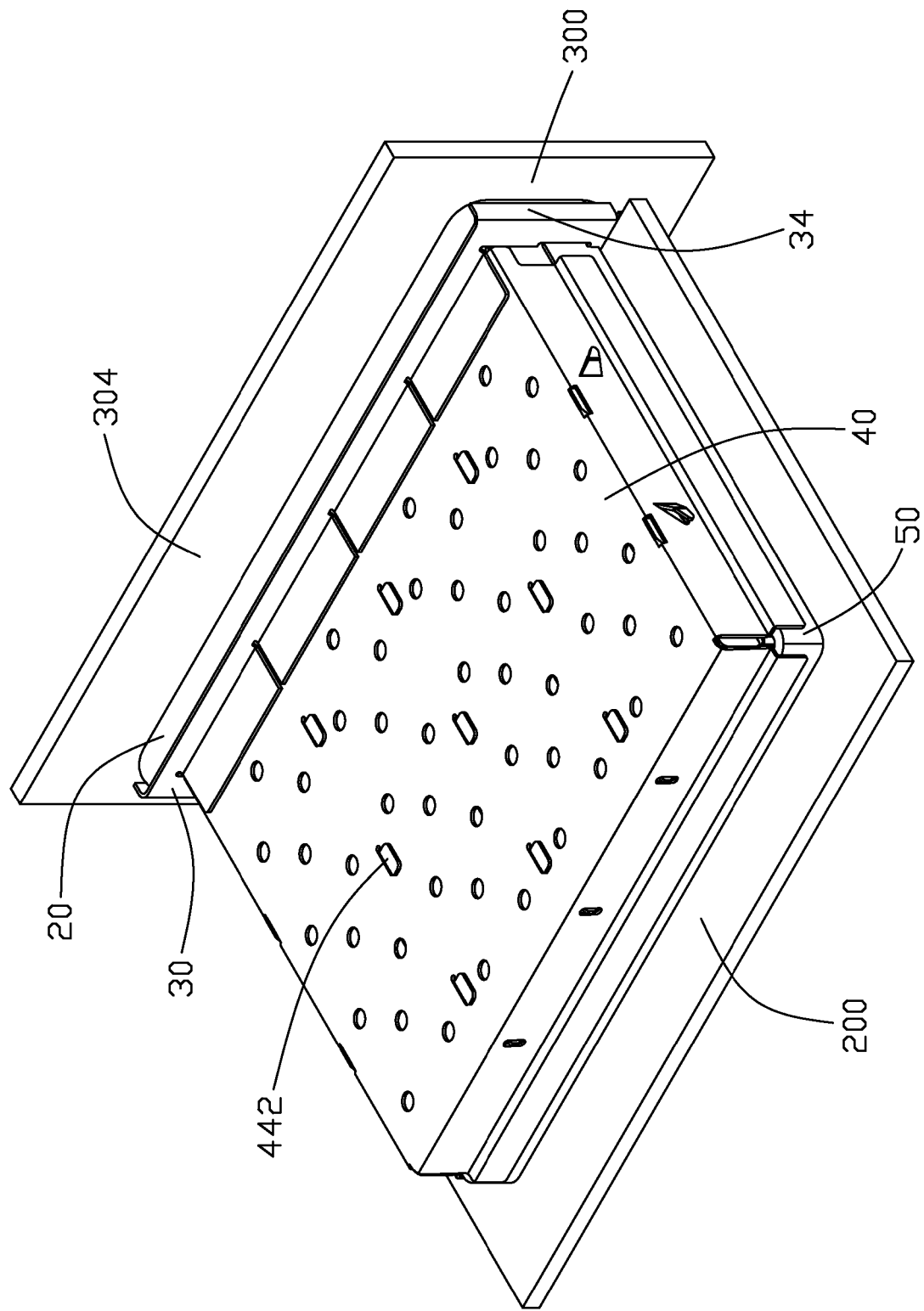
FIG. 4 is an assembled view of the shielding assembly mounted on a circuit board and installed in a front panel of a device.

Referring to FIGS. 1 and 4, a shielding assembly 100 of an exemplary embodiment of the present invention is shown. The shielding assembly 100 is mounted on a circuit board 200 for housing one or more electronic modules (not shown). Electronic modules are typically used to provide a connection between circuits on the circuit board 200 and another electronic device. The electronic modules are plugged into individual connectors (not shown) mounted to the circuit board 200 and have an opening that communicates with the exterior of a device through a front panel 300 of the device.

The shielding assembly 100 includes a first gasket 20, a substantially rigid and conductive backing member 30, a cage 40, and an electrically-conductive compressible second gasket 50.

Figure 2:
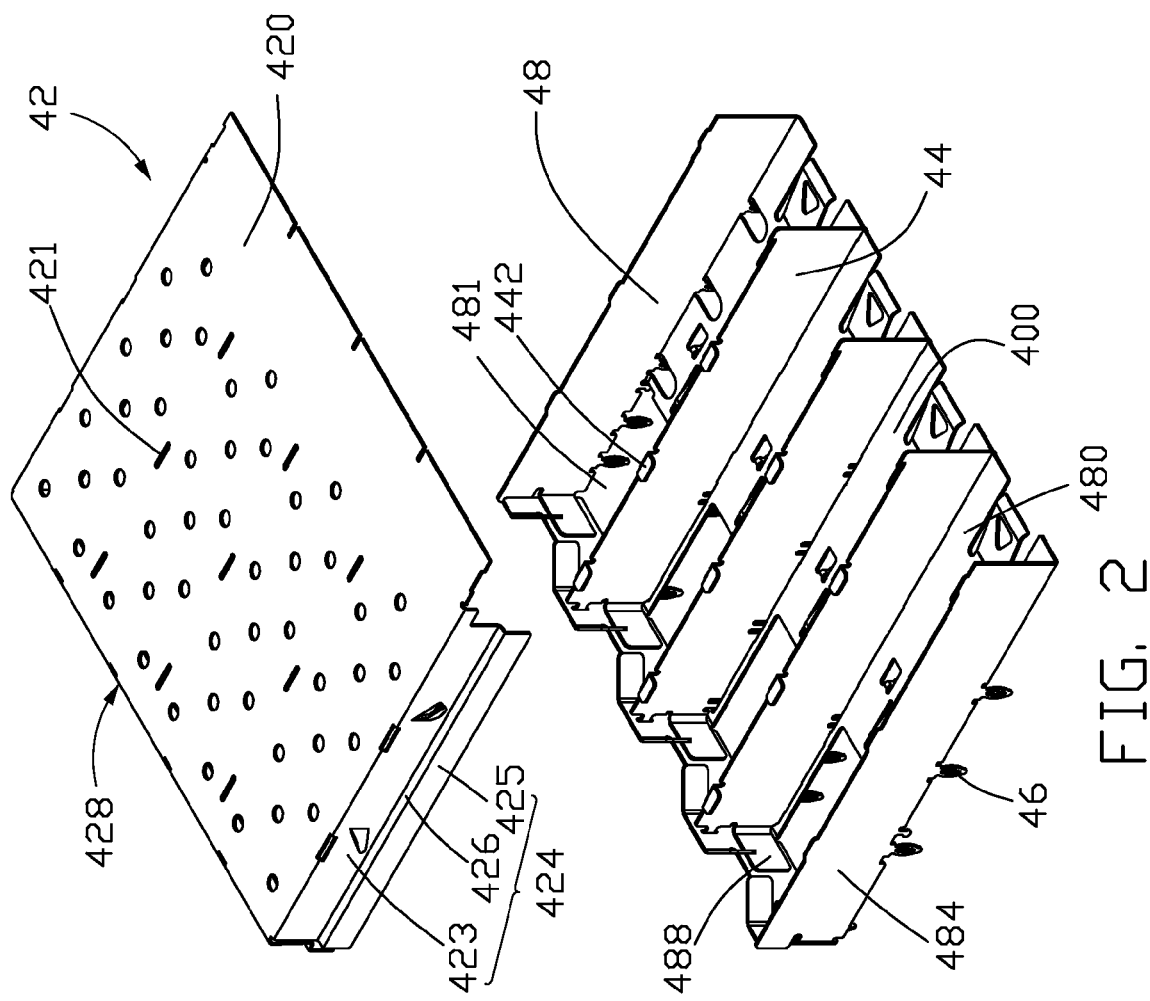
FIG. 2 is an inverted view of the cage of FIG. 1.

Referring also to FIG. 2, the cage 40 is configured for housing the modules and shielding the modules from external electromagnetic waves, as well as containing electromagnetic waves emanating from the modules. The cage 40 is substantially rectangular and it will be understood that other configurations may be utilized. The cage 40 is constructed from sheet metal and includes a top wall 420, a pair of first sidewalls 424, a first rear wall 428, a bottom wall 480, a pair of second sidewalls 484, and a second rear wall 488, all of which are designated as exterior walls of the cage 40, and a plurality of interior walls 44. The interior walls 44 are electrically and mechanically coupled to the top wall 420 and the bottom wall 480, thereby several interior spaces 400 are formed in an interior of the cage 40 for receiving the electronic modules. Several openings 481 are defined in a rear end portion of the bottom wall 48, and communicate with the interior spaces 400. The connectors (not shown) mounted on the circuit board 200 are electrically connected to the electronic modules via the openings 481.

In the exemplary embodiment, some of the exterior walls, namely, the bottom wall 480, the second sidewalls 484, and the second rear wall 488 cooperatively define a base 48 of the cage 40, while the top wall 420, the first sidewalls 424 and the first rear wall 428 cooperatively define a cover 42 of the cage 40. Although a two-part portion of the cage 40 is shown for purpose of illustration, it will be understood that the exterior walls may be formed together from a single piece of sheet metal. Those of ordinary-skill in the art of sheet metal fabrication will recognize that the various exterior walls can be readily formed by bending a single piece of sheet metal. In various alternate embodiments, the various exterior walls 420, 424, 428, 480, 484, and 488 can also be formed from one or more individually stamped panels that are assembled into the cage 40.

Referring to FIGS. 1 and 2, the cage 40 further includes a receiving room 47 for receiving the second gasket 50. The receiving room 47 is formed among some of the exterior walls, namely, the first sidewalls 424, the first rear wall 428, the second sidewalls 484, and the second rear wall 488. In the exemplary embodiment, each of the first sidewalls 424 and the first rear wall 488 includes a main body 423 depending from an edge of the top wall 420, a skirt 425 parallel to the main body 423, and a step portion 426 connecting the main body 423 and the skirt 425. When the cover 42 and the base 48 are assembled together, the first sidewalls 424 and the first rear wall 428 overlap the second sidewalls 484 and the second rear wall 488 respectively, and a distance between the skirt 425 and one of the second sidewalls 484 and the second rear wall 488 is greater than a distance between the main body 423 and one of the second sidewalls 484 and the second rear wall 488, thereby the receiving room 47 is formed.

Referring to FIG. 2, in the exemplary embodiment, the number of the interior walls 44 is three. The interior walls 44 of the cage 40 are oriented substantially perpendicular to both the top wall 420 and the bottom wall 480 so as to define the module spaces 400, wherein the electronic modules can be installed and protected from EMI absorption or their EMI transmission escaping therefrom. The interior walls 44 are preferably maintained in orthogonal (top and bottom) orientation by a plurality of engagement tabs 442 that are formed with and disposed on the top of each interior wall 44. Two of the interior walls 44 are also further preferably maintained in their orientation by a plurality of longer grounding lugs 46, which are of a length sufficient to extend through corresponding holes 482 in the bottom wall 480 into the circuit board 200 on which the cage 40 is preferably mounted and to which it would be grounded. The grounding lugs 46 are illustrated as "eye of needle" style compliant pins. One of the interior walls 44 are also further preferably maintained in their orientation by several engagement lugs 444, which are of a length sufficient to extend through corresponding holes 482 in the bottom wall 480 into the circuit board 200 on which the cage 40 is preferably mounted and to which it would be grounded. In other embodiments, each of the interior walls 44 may include a plurality of grounding lugs 46 instead of the engagement lugs 444.

The engagement tabs 442 of the interior walls 44 are sized and shaped to protrude through corresponding slots 421 disposed in the top wall 420. While such engagement tabs 442 are provided on the interior walls 44 for their fixation and electrical coupling to the top wall 420, the exterior sidewalls 424 and 484 can also be provided with engagement tabs 442 by which the exterior sidewalls 424 and 484 can be joined to the top wall 420 and the bottom wall 480 respectively, provided of course that the top wall 420 and the bottom wall 480 are of sufficient length and provided with the requisite complementary slots 421 into which the engagement tabs 442 would be inserted.

In being "complementary", the slots 421 are of a width and length such that the engagement tabs 442 preferably fit through the slots 421 without excessive play. When the engagement tabs 442 protrude through the slots 421 in the top wall 420, they may be peened, swaged, knurled, soldered, brazed, welded or glued in place, thereby mechanically and electrically bonding the interior walls 44 to the cover 42. Those of ordinary skill in the art will recognize that the engagement tabs 442 could be peened, swaged, knurled at only the top or bottom. In addition to being peened, swaged or knurled, the engagement tabs 442 can also be soldered, brazed, welded or glued using an electrically conductive adhesive, all of which are considered to be equivalent embodiments of peened or knurled engagement tabs 442. Seven such engagement tabs 442 are shown in the drawings and they are spaced apart from each other lengthwise of the cage 40, and some or all of them may be aligned with each other along the top edges of the interior walls 44.

The grounding lugs 46 and the engagement lugs 444 of the interior walls 44 are located at the bottom thereof. And, one of the cover 42 and the base 48 further includes a plurality of grounding lugs 46 at the bottom thereof. By using the grounding lugs 46 and the engagement lugs 444 that are closely and regularly spaced across the bottom area of the cage 40, and by electrically joining the grounding lugs 46 and the engagement lugs 444 to a reference potential on the circuit board 200, EMI to electronic modules in the interior space 400 is more quickly routed to ground or a reference potential, thereby providing improved EMI suppression.

As can be seen in FIG. 4, the cage 40 is associated and aligned with the front panel 300 of the device, which has an opening formed therein through which the electronic modules can be passed into the interior spaces 400 of the cage 40. The front panel 300 is typically conductive and it may also provide additional EMI suppression, but can also provide a substrate to which labeling can be applied. As shown in FIG. 4, the front panel 300 is sized and shaped such that the opening encases or encircles a front end portion 41 of the cage 40 extending toward the front panel 300 of the device. Inasmuch as the front panel 300 is placed around the top wall 420, the first sidewalls 424, the bottom wall 480 and the second sidewalls 424, the dimensions of the opening of the front panel 300 do not normally allow for a tight mechanical bond and a tight electrical connection between the front panel 300 and the exterior walls 420, 424, 480, 484 of the cage 40.

An improved electrical connection between the front panel 300 and the exterior walls of the cage 40 is provided by the first gasket 20 that is located behind the front panel 300. The first gasket 20 is formed of electrically conductive material. In the exemplary embodiment, the first gasket 20 is made up of conductive resilient rubber such that it is readily pliable and will conform to the exterior walls of the cage 40, regardless of shape irregularities and imperfections in their surfaces. The first gasket 20 touches both a rear surface 304 of the front panel 300 and exterior perimeter of the cage 40, by way of its bottom wall 480, first sidewalls 424, second sidewalls 484 and top wall 420 thereof, to thereby provide a substantially continuous electrical connection between them. The first gasket 32 helps to provide EMI shielding by grounding the front panel 300 to the exterior walls of the cage 40, which itself is grounded to ground circuits of the circuit board 200. As shown in FIG. 1, in the exemplary embodiment, the first gasket 20 is generally an O-shaped loop. The first gasket 20 has elasticity that maintains the first gasket 20 in a pre-selected position and prevents the first gasket 20 from detaching from the front end portion 41 of the cage 40.

The first gasket 20 is located directly behind the front panel 30 but in front of the backing member 30. Inasmuch as the first gasket 20 is compressible, the backing member 30 is sized and shaped so as to assist in compressing the first gasket 32 between the front panel 300 and the cage 40 at its exterior the top wall 420, the first sidewalls 424, the second sidewalls 484, and the bottom walls 480.

As can be seen in FIG. 1, the backing member 30 includes several supporting portions 34 to support the first gasket 20, several engagement portions 36 to hold the backing member 30 in place on the cage 40, and an opening 38 defined in a central portion thereof. In the exemplary embodiment, the supporting portions 34 are stamped and formed from the bottom and side portions of the backing member 30. The engagement portions 36 are stamped and formed from a top and the side portions of the opening 38. An extending direction of each supporting portion 34 is opposite to an extending direction of each engagement portion 36. The backing member 30 is maintained in a pre-selected position and is prevented from moving further towards the back on the cage 40 exterior through the engagement portion 36 being molded on the exterior perimeter of the cage 40. The backing member 30 is sized and shaped such that the opening 38 encases or encircles the exterior perimeter of the cage 40. Inasmuch as the backing member 30 is placed around exterior perimeter of the cage 40, the dimensions of the opening 38 of the backing member 30 do not normally allow for a tight mechanical bond connection between the backing member 30 and the exterior perimeter of the cage 40.

A depth of the first gasket 20 is greater than a distance between the backing member 30 and the rear surface 304 of the front panel 300 when the shielding assembly and the front panel 300 are assembled together, thus the first gasket is compressed to ensure a reliable conductive contact around the exterior perimeter of the cage 40 at the opening of the front panel 300. Furthermore, when the backing member 30 is pressed against the first gasket 20, the supporting portions 34 of the backing member 30 mechanically and electrically contact the first gasket 20. The mechanically and electrically contact between the supporting portions 34 of the backing member 30 and the first gasket 20 will thus provide electrical continuity between the front panel 300 and the exterior walls 420, 424, 480, and 484.

An improved electrical connection between the circuit board 200 and the cage 40 is provided by the second gasket 50 that is received in the receiving room 47 of the cage 40. The second gasket 50 is fabricated as a pad from conductive material. In the preferred embodiment, the second gasket 50 is made up of small-diameter woven wire of sufficient stiffness such that it is readily pliable and will conform to the exterior panels, regardless of shape irregularities and imperfections in their surfaces. In other embodiments, the second gasket 50 may be formed from a compressible and pliant plastic, such as a foam rubber, which is composed of entirely metallized layer(s) by metal plating the exterior surfaces thereof or the like. The second gasket 32 touches both the circuit board 200 and the cage 40, by way of its first sidewalls 424, first rear wall 428, second sidewalls 484 and second rear wall 488 thereof, to thereby provide a substantially continuous electrical connection between them, so as to help shield the electronic modules from external electromagnetic waves, as well as to contain electromagnetic waves emanating from the electronic modules in the cage 40. A thickness of the second gasket 50 is greater than a width of the receiving room 47 of the cage 40 so that the second gasket 50 is compressed, the cover 42 and the base 48 are assembled together to shield seal between the cage 40 and the circuit board 200.

Figure 3:
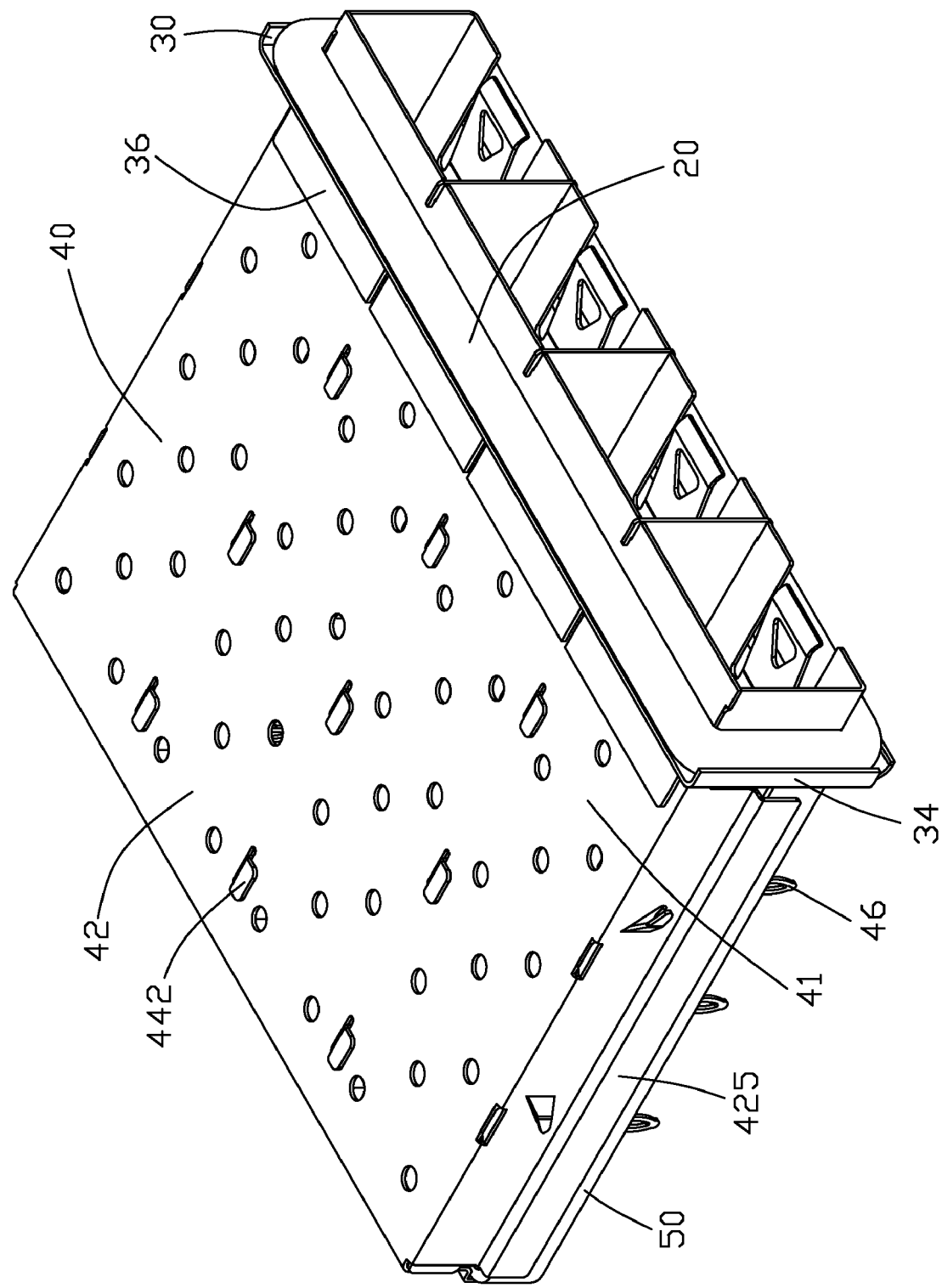
FIG. 3 is an assembled view of the shielding assembly of FIG. 1.

Referring to FIGS. 2-4, in assembly, the cover 42, the base 48 and the interior walls 44 are assembled into the cage 40. The backing member 30 is mounted to the front end portion 41 of the cage 40 with the engagement portion 36 being soldered on the exterior perimeter of the front end portion of the cage 40. The first gasket 20 is fixed to the front end portion 41 of the cage 40 and abuts against the supporting portions 34 of the backing member. Thus, the cage 40, the first gasket 20, the second gasket 50, and the backing member 30 are mounted into the shielding assembly 100. Next, the shielding assembly 100 is installed on the circuit board 200 by the grounding lugs 46 and the engagement lugs 444 of the cage 40 being inserted into the circuit board 200. The assembly of the shielding assembly 100 and the circuit board 200 is installed in the device with the first gasket 20 abutting against the rear surface 304 of the front panel 300.

Because the first gasket 20 is mounted between the front panel 300 and the cage 40, front gaps between the cage 40 and the front panel 300 are sealed by the first gasket 20. Thus, electromagnetic waves from external sources cannot enter the cage 40 through the front gaps, and the electromagnetic waves emanating from within the electronic module cannot escape through the front gaps.

Because the second gasket 50 is received in the receiving room 47 of the cage 40, rear gaps between the cage 40 and the circuit board 200 are sealed by the second gasket 50. Therefore, electromagnetic waves from external sources cannot enter the cage 40 through the rear gaps, and the electromagnetic waves emanating from the electronic module and the connector cannot escape through the rear gaps.

In other embodiments, the electrically-conductive compressible second gasket 50 is made up of a compressible foam treated or infused with electrically-conductive material. A layer of adhesive can also be applied to the interior and exterior surfaces of the second gasket 50 to hold the second gasket 50 in place.

In other embodiments, the cage 40 can only comprise the top wall 420, the first sidewalls 424, the first rear wall 428, the bottom wall 480, the second sidewalls 484, and the second rear wall 488.

While exemplary embodiments have been described above, it should be understood that they have been presented by way of example only and not by way of limitation. Thus the breadth and scope of the present invention should not be limited by the above-described exemplary embodiments, but should be defined only in accordance with the following claims and their equivalents.

What is claimed is:

1. A shielding assembly for enclosing a plurality of electronic modules, the shielding assembly comprising:
   a cage for mounting to a circuit board, the cage comprising a plurality of exterior walls, at least one interior wall, at least two spaces, and a receiving room formed among the exterior walls, the exterior walls and the at least one interior wall cooperatively defined the at least two spaces for receiving the modules; and
   a electrically-conductive, compressible gasket received in the receiving room, the gasket electrically contacting the cage and the circuit board to provide an electromagnetic interference seal between the cage and the circuit board;
   wherein the exterior walls comprise a top wall, first sidewalls, a first rear wall, a bottom wall, second sidewalls, and a second rear wall, the top wall, the first sidewalls and the first rear wall cooperatively defining a cover, the bottom wall, the second sidewalls and the second rear wall cooperatively defining a base; and wherein each of the first sidewalls and the first rear wall comprises a main body depending from the top wall, a skirt parallel to the main body, and a step formed between the main body and the skirt.

2. The shielding assembly of claim 1, wherein a thickness of the gasket is greater than a width of the receiving room before the gasket is mounted into the receiving room.

3. The shielding assembly of claim 1, wherein when the cover and the base are assembled together, the first sidewalls and the first rear wall overlap the second sidewalls and the second rear wall, respectively.

4. The shielding assembly of claim 1, wherein a distance between the main body and one of the second sidewalls and the second rear wall is less than a distance between the skirt and one of the second sidewalls and the second rear wall, thereby the receiving room is formed.

5. The shielding assembly of claim 1, further comprising a backing member installable on a front end portion of the cage.

6. The shielding assembly of claim 5, further comprising another gasket abutting against the backing member for reducing electromagnetic interference.

7. The shielding assembly of claim 6, wherein the another gasket is made up of conductive resilient rubber that fixes the another gasket on a front end portion of the cage.

8. The shielding assembly of claim 6, wherein the backing member comprises several supporting portions for backing the another gasket and several engagement portions to hold the backing member on the front end portion of the cage.

9. A shielding assembly for protecting a plurality of electrical modules from electromagnetic interference, the shielding assembly comprising:
- a cage installable on a circuit board, the cage comprising a front end portion, a cover, a base, a receiving room formed between the cover and the base, and at least one interior wall, the cover, the interior wall, and the base cooperatively defining at least two spaces for receiving the modules;
- a conductive first gasket encircling the front end portion of the cage, the first gasket electrically and mechanically contacting the cover and the base to provide an electromagnetic interference seal between the cage and a device in which the cage is mounted; and
- an electrically-conductive, compressible second gasket received in the receiving room and attachable against the cage and the circuit board respectively so as to electrically shield the modules in the cage from electromagnetic interference;
- wherein the cover comprises a top wall, a pair of first sidewalls and a first rear wall, and the base comprises a bottom wall, a pair of second sidewalls, and a second rear wall, wherein the first sidewalls and the first rear wall overlap the second sidewalls and the second rear wall respectively when the cover and the base are assembled together; and wherein each of the first sidewalls and the first rear wall comprises a main body depending from the top wall, a skirt parallel to the main body and a step connecting the main body and the skirt.

10. The shielding assembly of claim 9, further comprising a backing member mounted to the front end portion of the cage and behind the first gasket, for supporting the first gasket.

11. The shielding assembly of claim 10, wherein the backing member comprises several supporting portions for backing the first gasket and several engagement portions to hold the backing member on the cage.

12. The shielding assembly of claim 9, wherein a thickness of the second gasket is greater than a width of the receiving room before the second gasket is mounted into the receiving room.

13. The shielding assembly of claim 9, wherein a distance between the between the main body and one of the second sidewalls and the second rear wall is less than a distance between the skirt and one of the second sidewalls and the second rear wall when the cover is assembled on the base, thereby the receiving room is formed.

14. An assembly for shielding an electronic module therein from electromagnetic interference, comprising:
- a conductive cage defining a space therein for receiving said electronic module, first sidewalls, a first rear wall, second sidewalls, a second rear wall, and a receiving room defined between the first sidewalls and the first rear wall and the second sidewalls and the second rear wall, and accessible from an entrance facing said circuit board; and
- an electrically-conductive compressible gasket installable into said receiving room from said entrance and extending out of said receiving room toward said circuit board, said gasket physically and electrically engaging with said cage and said circuit board simultaneously so as to provide electrically shielding between said cage and said circuit board;
- wherein each of the first sidewalls and the first rear wall comprises a main body depending from the top wall, a skirt parallel to the main body and a step connecting the main body and the skirt.

15. The assembly of claim 14, wherein a distance between the between the main body and one of the second sidewalls and the second rear wall is less than a distance between the skirt and one of the second sidewalls and the second rear wall when the cover is assembled on the base, thereby the receiving room is formed.

16. The assembly of claim 14, further comprising a backing member installable on a front end portion of the cage.

17. The assembly of claim 16, further comprising another gasket abutting against the backing member for reducing electromagnetic interference.

18. The assembly of claim 17, wherein the backing member comprises several supporting portions for backing the another gasket and several engagement portions to hold the backing member on the front end portion of the cage.

* * * * *